(12) United States Patent
Corbin, Jr. et al.

(10) Patent No.: US 7,687,894 B2
(45) Date of Patent: Mar. 30, 2010

(54) IC CHIP PACKAGE HAVING AUTOMATED TOLERANCE COMPENSATION

(75) Inventors: John S. Corbin, Jr., Austin, TX (US); David L. Edwards, Poughkeepsie, NY (US); David C. Long, Wappingers Falls, NY (US); Jason S. Miller, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 594 days.

(21) Appl. No.: 11/535,740

(22) Filed: Sep. 27, 2006

(65) Prior Publication Data
US 2008/0073765 A1    Mar. 27, 2008

(51) Int. Cl.
*H01L 23/02* (2006.01)
(52) U.S. Cl. ............... 257/678; 257/727; 257/731; 257/704

(58) Field of Classification Search ............... 257/678, 257/727, 731, 704, 707, 708, 710; 438/121, 438/125
See application file for complete search history.

(56) References Cited

U.S. PATENT DOCUMENTS

| 6,634,095 | B2 | 10/2003 | Colbert et al. |
| 6,757,965 | B2 | 7/2004 | Colbert et al. |
| 7,344,919 | B2 * | 3/2008 | McAllister et al. .......... 438/108 |
| 2004/0141296 | A1 | 7/2004 | Coico et al. |

* cited by examiner

*Primary Examiner*—Thinh T Nguyen
(74) *Attorney, Agent, or Firm*—Joseph Petrokaitis; Hoffman Warnick LLC

(57) ABSTRACT

An IC chip package and related method are disclosed. The IC chip package may include a printed circuit board (PCB) coupled to a chip module by a land grid array (LGA) connector, a metal stiffener including a fluid-based pressure compensator contacting an underside of the PCB, and at least two couplers for coupling the metal stiffener to the chip module, with the PCB and the LGA connector therebetween. The fluid-based pressure compensator automatically compensates for natural and non-systematic out-of flatness tolerances of the PCB and the chip module, and non-uniform thickness of the PCB while creating a substantially uniform contact force on the LGA.

4 Claims, 3 Drawing Sheets

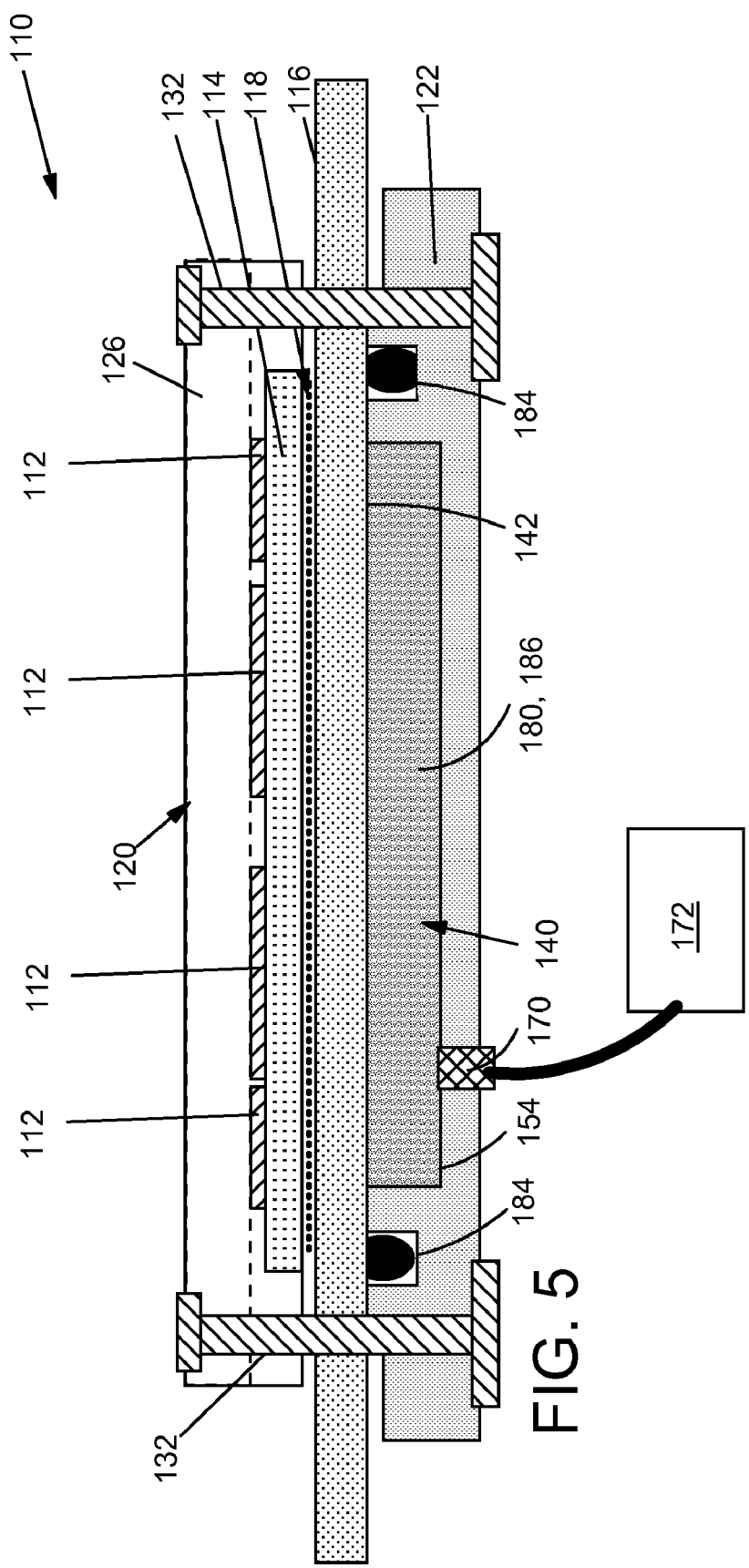

IC CHIP PACKAGE HAVING AUTOMATED TOLERANCE COMPENSATION

BACKGROUND OF THE INVENTION

1. Technical Field

The invention relates generally to integrated circuit (IC) chip packaging, and more particularly, to an IC chip package having automated tolerance compensation.

2. Background Art

Referring to FIG. 1, conventional integrated circuit (IC) chip package 10 includes a chip module 20 mating with a printed circuit board (PCB) 16 via a land grid array (LGA) connector 18. Chip module 20 may include IC chip(s) 12 packaged on a single or multiple chip carrier 14. Chip package 10 further includes a metal stiffener 22, which may have a rigid insulator 24 therein to prevent metal stiffener 22 from shorting the underside of PCB 16. Lid 26 may include a piston and a spar (not shown), which provide for a customized thermal paste gap for individual chips and improved mechanical linkage between lid 26 and chip carrier 14, respectively. Metal stiffener 22 and chip module 20 are coupled together by screws/bolts 32 and springs (not shown) to provide the compression load between chip package 10 and the board necessary to electrically interconnect metal stiffener 22 and chip module 20 via LGA connector 18. The springs may be coil springs or Belleville washers. In alternative arrangements, a heat sink (not shown) may be provided over lid 26.

Ideally, chip package 10 has uniform pressure applied to chip carrier 14 and PCB 16. Although an individual LGA connector 18 contact force requires only 20-60 grams to ensure robust performance over product lifetime, contact force is notoriously non-uniform, especially on a large multichip carrier 14. Most LGA connectors 18 utilize an array of connectors distributed within, and positioned by an interposer (not shown) that is sandwiched between module 20 and PCB 16. Pressure is applied to chip package 10 via screws/bolts 32 and springs (not shown) to mechanically deform the contacts so that sufficient pressure is developed and maintained to establish and maintain electrical connections. In order to assure proper electrical performance, there is a minimum design load that needs to act across each contact of LGA connector 18. Design tolerances and mechanical deflections of components leads to contact force non-uniformity, which may have several causes. First, the retention screws/bolts 32 with springs (not shown) are of necessity outside the periphery of rigid LGA connector 18. The collective contact forces thus tend to flex chip carrier 14, PCB 16 and/or metal stiffener 22, and locally tends to push parts away from each other. This situation also tends to relax contact forces in the center of LGA connector 18. In an alternate load configuration, the load from metal stiffener 22 is near the centerline of module 20, so that the components flex in similar directions. Second, PCBs 16 and chip carriers 14 originate having significant non-planarity, which varies in magnitude and pattern from part to part. Third, PCBs 16 have varying thicknesses. The less uniform the loading, the more total force is required to assure sufficient performance at each contact. For example, to insure that even the lowest force sites reach the minimum required contact force, the total clamping, or retention, force applied by screws/bolts 32 and springs (not shown) must be increased, typically to the equivalent of 90-105 grams per contact (i.e., an overload). In addition, the contact force can vary at different locations on LGA connector 18. In some cases, component tolerance can be so severe that even additional load will not guarantee sufficient load at every contact.

Higher loads increase cost because they require more robust structures to apply them, and these higher loads risk damaging or even breaking the components. In some instances, additional layers are provided in chip carrier 14, to address this problem, but this approach impacts cost and electrical performance. For example, as shown in FIGS. 2 and 3, a polymer bulls-eye structure 36 may be added above rigid insulator 24 to help compensate for flexure by reinforcing the pressure at the center of chip package 10. Polymer bulls-eye structure 36 prevents having to increase the retention force of screws/bolts 32 even further. Unfortunately, polymer bulls-eye structure 26 can only be designed based on particular corresponding PCB 16 structure, and can not automatically conform to PCB 16 process variations. If PCB 16 thickness variation changes, structure 36 may actually make the force distribution worse, even leading to fracture of the module or chip carrier.

SUMMARY OF THE INVENTION

An IC chip package and related method are disclosed. The IC chip package may include a printed circuit board (PCB) coupled to a chip module by a land grid array (LGA) connector, a metal stiffener including a fluid-based pressure compensator contacting an underside of the PCB, and at least two couplers for coupling the metal stiffener to the chip module, with the PCB and the LGA connector therebetween. The fluid-based pressure compensator automatically compensates for natural and non-systematic out-of flatness tolerances of the PCB and the chip module, and non-uniform thickness of the PCB while creating a substantially uniform contact pressure on the LGA.

A first aspect of the invention provides a chip package comprising: a printed circuit board (PCB) coupled to a chip module by a land grid array (LGA) connector; a metal stiffener including a fluid-based pressure compensator contacting an underside of the PCB; and at least two couplers for coupling the metal stiffener to the chip module, with the PCB and the LGA connector therebetween.

A second aspect of the invention provides a method packaging an integrated circuit (IC) chip, the method comprising: providing a chip module and a printed circuit board (PCB) coupled to the chip module by a land grid array (LGA) connector, the chip module holding the IC chip; coupling the chip module to a metal stiffener with the PCB and the LGA connector therebetween, the metal stiffener including at least one fluid-based pressure compensator contacting an underside of the PCB; and using the at least one fluid-based pressure compensator to automatically compensate for geometric variations in the PCB, the LGA connector and the chip module.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 5 shows another embodiment of an IC chip package according to the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
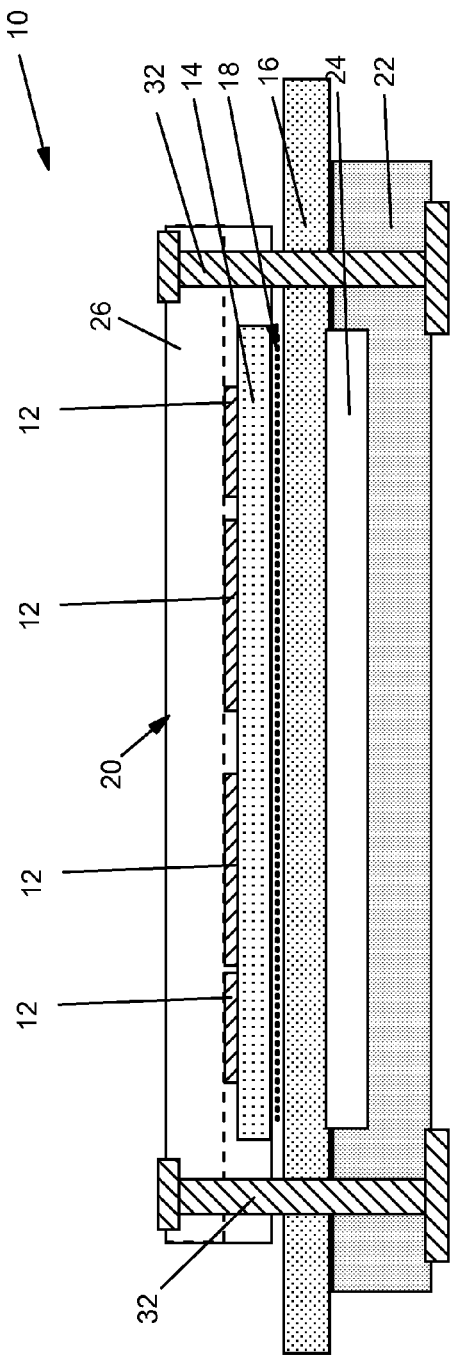
FIG. 1 shows a conventional IC chip package.
Figure 2:
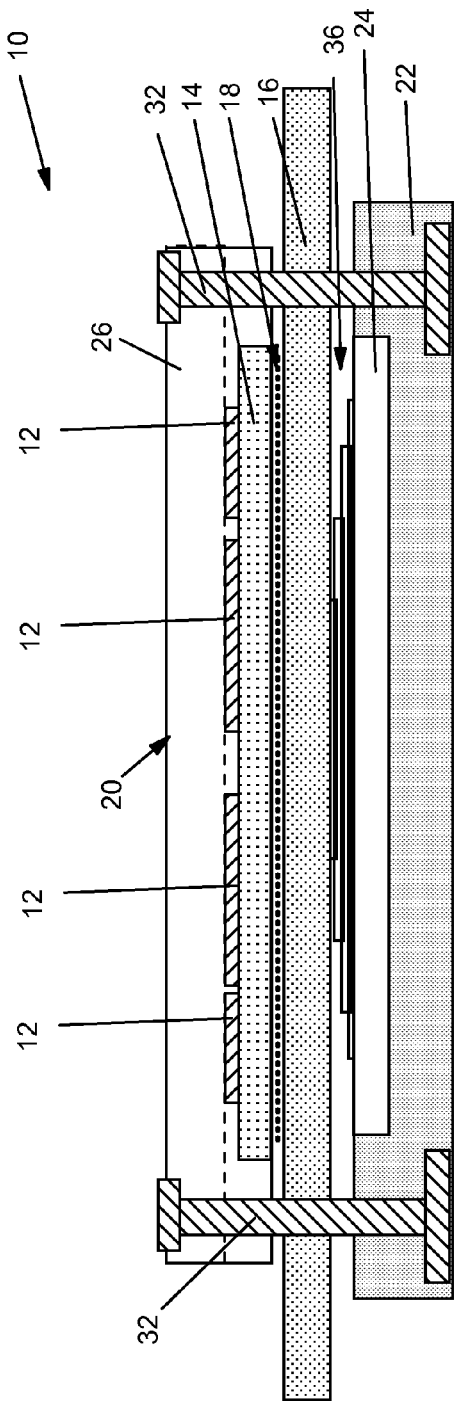
FIG. 2 shows an alternative conventional IC chip package.
Figure 3:
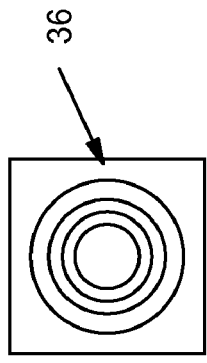
FIG. 3 shows a detail of the IC chip package of FIG. 2.
Figure 4:
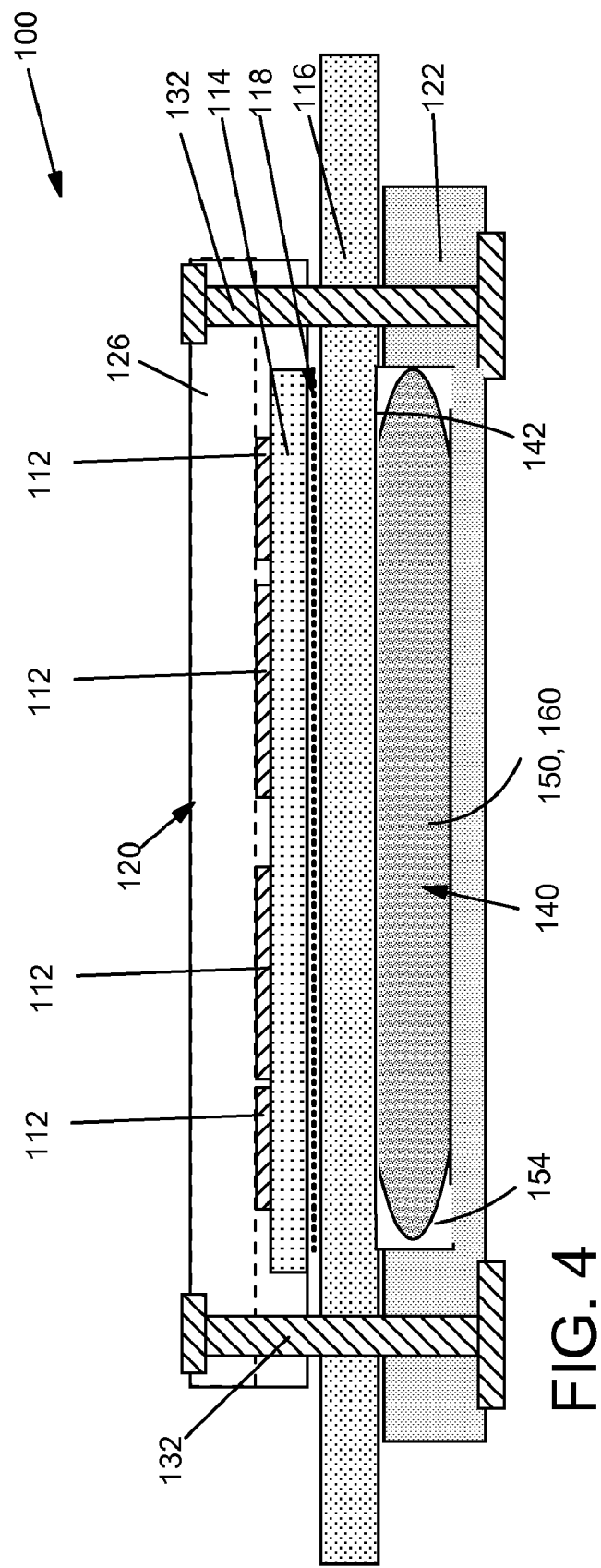
FIG. 4 shows one embodiment of an IC chip package according to the invention.

Turning to the drawings, FIG. 4 shows one embodiment of an integrated circuit (IC) chip package 100 according to the invention. IC chip package 100 includes a printed circuit board (PCB) 116 coupled to a chip module 120 by a land grid array (LGA) connector 118. Chip module 120 may include IC chip(s) 112 packaged on a single or multiple chip carrier 114. The material used to fabricate chip carrier 114 may include a ceramic or a plastic, the latter of which are typically much more flexible and non-flat. Chip module 120 also includes a lid 126. In alternative arrangements, a heat sink (not shown) may be provided over lid 126. Chip module 120 is coupled to a metal stiffener 122 by at least two couplers 132 with PCB 116 and LGA connector 118 therebetween.

Metal stiffener 122 includes a fluid-based pressure compensator 140 contacting an underside 142 of PCB 116, which provides automated tolerance compensation and enables relaxation of flatness and thickness variation tolerances. Fluid-based pressure compensator 140 may be positioned in a recess 154 of metal stiffener 122. In one embodiment, fluid-based pressure compensator 140 includes a fluid filled sealed packet 150 within recess 154 of metal stiffener 122. Sealed packet 150 may be made of any durable and fluid-impervious material such as plastic, a metal foil or other materials known in the art. In one embodiment, fluid 160 may include a gel such as a silicone based material. In this case, shifting of chip package 100 during shipping or use or aging may be compensated by fluid based pressure compensator 140. In another embodiment, fluid 160 may include a curable material and may reduce the life requirements of the seal of fluid sealed packet 150. In another embodiment, the curable fluid remains flexible after curing. In one embodiment, fluid filled sealed packet 150 may include two different polymer materials such as a resin and a catalyst, in advance, with a separating membrane that can easily be ruptured just prior to assembly. Fluid 160 may cure at room temperature or near usage temperature. Another embodiment may include a fluid 160 in the form of a very viscous material that fills recess 154, which never cures, yet does not require a tight seal, e.g., like a putty. Fluid 160, however, may take a variety of other forms. For example, fluid 160 may include, but is not limited to, incompressible liquids such as: water, oil, etc.

Although one particular embodiment of a fluid based pressure compensator 140 has been disclosed herein, it is understood that a variety of different mechanisms may be employed within the scope of the invention. For example, FIG. 5 shows another embodiment in which a fluid based pressure compensator 140 is provided by a pressurized putty 180 within recess 154 of metal stiffener 122. In other embodiments, recess 154 may be sealed 184 against PCB 116 and a pressurized fluid 186, e.g., air, oil, etc., and may be injected into recess 154. FIG. 5 also shows another alternative embodiment including a port 172 coupled to bellows 172 for controlling the pressure for pressurized fluid 186.

In operation, IC chip(s) 112 may be packaged by providing chip module 120 and PCB 116 coupled to chip module 120 by LGA connector 118. Chip module 120 holds at least one IC chip 112. Next, chip module 120 is coupled to metal stiffener 122 with PCB 116 and LGA connector 118 therebetween. As noted above, metal stiffener 122 includes at least one fluid-based pressure compensator 140 contacting underside 142 of PCB 116. At least one fluid-based pressure compensator 140 is used to automatically compensate for a non-uniform spring force applied to at least one of PCB 116, LGA connector 118 and chip module 120. One embodiment may include simply providing fluid-based pressure compensator 140. Where fluid 160 includes a curable material, the method may further include curing fluid 160. As noted above, in one embodiment the curable material should remain flexible after curing.

As a result of fluid based pressure compensator 140, couplers 132 with springs (not shown) may need less force, thus significantly reducing component size and cost, and component flexure. Accordingly, geometric variations such as chip module 120 out of flatness, PCB 116 out of flatness and PCB 116 thickness variations can be accommodated. Fluid based pressure compensator 140 provides a nearly uniform pressure under LGA connector 118. Moreover, by applying a particular pressure for each chip package 100, the pressure will be automatically individualized to the dimensional idiosyncrasies of that particular set of parts. The correct pressure may be determined by prior experimentation. This enables relaxation of flatness and thickness variation tolerances.

The above-described embodiments may also be applied to non-LGA connector 118 applications that demand a high degree of stability over time. For example, bare die assemblies using column grid array (CGA) or ball grid array (CBGA) modules that do not require high compression loads mandated by LGA connector 118. Some methods of bare die interface of large mass heat sinks essentially anchor the heat-sink to the surrounding structure, while applying a moderate load (typically around 40 lb) to maintain a compressive load between the module and anchored heatsink. This level of compression load does not always fully remove the initial warp in PCB 116, and subsequent creep of PCB 116 as it flattens over time to conform to a backside stiffener can create relative motion between the module and the heatsink. For bare die interfaces which are typically very thin bond lines (30-40 μm typically), even small relative motion can disturb the thermal interface and significantly degrade its performance. A fluid based pressure compensator 140 may contribute to stabilizing the motion between PCB 116 and metal stiffener 122, and hence mitigate thermal performance degradation due to PCB 116 creep. Further, a fluid 160 in the form of a cured gel between PCB 116 and metal stiffener 122 could be used.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A chip package comprising:
   a printed circuit board (PCB) coupled to a chip module by a land grid array (LGA) connector;
   a metal stiffener including a fluid-based pressure compensator contacting an underside of the PCB, the fluid-based pressure compensator including a pressurized fluid filled sealed packet within a recess of the metal stiffener, the recess being sealed against the printed circuit board;
   a port coupled to the fluid-based pressure compensator and at least one bellow, the bellow and port providing control of the pressure of the pressurized fluid; and
   at least two couplers for coupling the metal stiffener to the chip module, with the PCB and the LGA connector therebetween.

2. The chip package of claim 1, wherein the fluid includes a gel.

3. The chip package of claim 1, wherein the fluid includes a curable material.

4. The chip package of claim 3, wherein the curable material remains flexible after curing.

* * * * *